United States Patent
Cho et al.

(10) Patent No.: US 8,944,564 B2
(45) Date of Patent: Feb. 3, 2015

(54) PRINTING APPARATUS AND METHOD FOR MANUFACTURING ORGANIC LIGHT EMITTING DIODE DISPLAY

(71) Applicant: Samsung Display Co. Ltd., Yongin-si, Gyeonggi-do (KR)

(72) Inventors: Sung-Hwan Cho, Yongin-si (KR); Sang-Jo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 15 days.

(21) Appl. No.: 13/744,156

(22) Filed: Jan. 17, 2013

(65) Prior Publication Data

US 2013/0286131 A1    Oct. 31, 2013

(30) Foreign Application Priority Data

Apr. 26, 2012    (KR) .......................... 10-2012-0043914

(51) Int. Cl.
  *B41J 2/01*      (2006.01)
  *H05B 33/10*     (2006.01)
  *B41J 2/155*     (2006.01)
  *H01L 51/00*     (2006.01)

(52) U.S. Cl.
  CPC . *H05B 33/10* (2013.01); *B41J 2/01* (2013.01); *H01L 51/0005* (2013.01); *B41J 2/155* (2013.01); *B41J 2202/09* (2013.01)
  USPC .............................................. 347/40; 347/41

(58) Field of Classification Search
  USPC .......... 347/5, 9, 12, 13, 20, 37, 40, 41, 42, 43
  See application file for complete search history.

(56) References Cited

U.S. PATENT DOCUMENTS

| | | | | |
|---|---|---|---|---|
| 6,837,568 B2 * | 1/2005 | Nakamura | ...................... | 347/40 |
| 7,048,357 B2 * | 5/2006 | Sato | ................................ | 347/41 |
| 7,093,924 B2 * | 8/2006 | Nakamura | ...................... | 347/40 |
| 7,101,440 B2 * | 9/2006 | Nakamura et al. | ............ | 118/663 |
| 7,455,389 B2 * | 11/2008 | Nakamura et al. | ............... | 347/40 |
| 7,513,595 B2 * | 4/2009 | Nakamura | ...................... | 347/40 |
| 2003/0142167 A1 * | 7/2003 | Nakamura et al. | ............... | 347/37 |
| 2007/0052753 A1 * | 3/2007 | Nakamura | ...................... | 347/43 |
| 2008/0210944 A1 * | 9/2008 | Nakamura et al. | ............... | 257/59 |
| 2009/0273631 A1 * | 11/2009 | Kayahara | ........................ | 347/40 |
| 2010/0067132 A1 * | 3/2010 | Nakamura | .................... | 359/891 |

FOREIGN PATENT DOCUMENTS

| | | |
|---|---|---|
| JP | 2005-093099 | 4/2005 |
| JP | 2011-054386 | 3/2011 |
| KR | 10-2004-0082281 A | 9/2004 |

* cited by examiner

*Primary Examiner* — Huan Tran
(74) *Attorney, Agent, or Firm* — Christie, Parker & Hale, LLP (57) ABSTRACT

A printing apparatus includes: a nozzle head including a nozzle head main body and a plurality of linear nozzle units for spraying a printing material, the linear nozzle units on one side of the nozzle head main body and elongated in parallel in a first direction; and a nozzle head driver connected to the nozzle head main body and configured to move the nozzle head in a second direction crossing the first direction. In such a printing apparatus, a dry spot due to a printing time difference may be reduced or prevented, a uniform printing pattern may be formed, printing quality may be improved, and defective products may be reduced. In addition, the effective spacing between separate spray nozzles may be reduced or minimized.

13 Claims, 9 Drawing Sheets

PRINTING APPARATUS AND METHOD FOR MANUFACTURING ORGANIC LIGHT EMITTING DIODE DISPLAY

CROSS-REFERENCE TO RELATED APPLICATION

This application claims priority to and the benefit of Korean Patent Application No. 10-2012-0043914, filed in the Korean Intellectual Property Office on Apr. 26, 2012, the entire content of which is incorporated herein by reference.

BACKGROUND (a) Field

Aspects of embodiments of the present invention relate to a printing apparatus and a manufacturing method of an organic light emitting diode (OLED) display using the printing apparatus.

(b) Description of the Related Art

Flat display devices such as organic light emitting diode (OLED) displays and liquid crystal displays (LCDs) commonly include a pixel pattern displaying an image. For example, LCDs include various pixel layer patterns such as thin film transistors, gate signal lines, data signal lines, pixel electrodes, black matrix, color filters, and common electrodes. Also, OLED displays include various pixel layer patterns such as anodes, electron injection layers (EILs), hole injection layers (HILs), cathodes, and organic layers.

For high performance and low cost of the flat display devices, research on screen printing, photosensitive pasting by a photolithography process, and ink-jet printing as a part of the manufacturing process have been actively developed. Among them, the ink-jet printing as a method of depositing ink in a desired pattern by spraying a printing material on a corresponding substrate of a display device from a nozzle under pressure has been recently spotlighted as a pattern forming method for high performance and low cost.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention relate to a printing apparatus and a manufacturing method of an OLED display using the printing apparatus. In further detail, aspects of embodiments of the present invention relate to a printing apparatus with reduced effective spacing between spray nozzles while also reducing or preventing drying stains in printing patterns, and a corresponding manufacturing method of an OLED display.

Further embodiments of the present invention provide for a printing apparatus capable of preventing or reducing the occurrence of dry spots due to a printing time difference of different spray nozzles, and realizing a uniform printing pattern, and a corresponding manufacturing method of an OLED display. In addition, embodiments of the present invention provide for a printing apparatus for reducing or minimizing the effective spacing between adjacent spray nozzles in a printing process, and a corresponding manufacturing method of an OLED display.

In an exemplary embodiment of the present invention, a printing apparatus is provided. The printing apparatus includes: a nozzle head including a nozzle head main body and a plurality of linear nozzle units for spraying a printing material, the linear nozzle units on one side of the nozzle head main body and elongated in parallel with each other in a first direction; and a nozzle head driver connected to the nozzle head main body and configured to move the nozzle head in a second direction crossing the first direction.

The second direction may be perpendicular to the first direction.

Each of the plurality of linear nozzle units may include a plurality of spray nozzles separated by a first interval in the first direction. Corresponding adjacent said spray nozzles from different ones of the plurality of linear nozzle units may be separated by a second interval that is smaller than the first interval in the first direction.

A number of the plurality of linear nozzle units may be N. The second interval may be 1/N times the first interval in the first direction.

The plurality of linear nozzle units may be movable with respect to each other in the second direction.

The plurality of linear nozzle units may be movable with respect to each other in the first direction.

In another exemplary embodiment of the present invention, a method of manufacturing an organic light emitting diode (OLED) display with a printing apparatus including a nozzle head having a nozzle head main body and a plurality of linear nozzle units for spraying an organic material is provided. The linear nozzle units are on one side of the nozzle head main body and elongated in parallel with each other in a first direction. The method includes forming an organic layer by using the printing apparatus to spray the organic material onto a substrate arranged opposite to the linear nozzle units while moving the nozzle head in a second direction crossing the first direction.

The second direction may be perpendicular to the first direction.

Each of the plurality of linear nozzle units may include a plurality of spray nozzles separated in the first direction by a first interval. Corresponding adjacent said spray nozzles from different ones of the plurality of linear nozzle units may be separated by a second interval that is smaller than the first interval in the first direction.

A number of the plurality of linear nozzle units may be N. The second interval may be 1/N times the first interval in the first direction.

The method may further include separating the plurality of linear nozzle units in the first direction before moving the nozzle head in the second direction such that an interval in the first direction between the spray nozzles of different ones of the linear nozzle units is controlled.

The forming of the organic layer may include: spraying the organic material onto the substrate from only a first one of the linear nozzle units while moving the nozzle head in a first movement in the second direction; and spraying the organic material onto the substrate from only a second one of the linear nozzle units while moving the nozzle head in a second movement in the second direction.

The first and second movements may be reciprocal movements between one end and another end of the substrate.

The method may further include separating the plurality of linear nozzle units in the second direction before moving the nozzle head in the second direction such that an interval in the second direction between the linear nozzle units is widened.

According to exemplary embodiments of the present invention, a dry spot due to a printing time difference may be reduced or prevented, a uniform printing pattern may be formed, printing quality may be improved, and defective products may be reduced. In addition, according to exemplary embodiments of the present invention, the effective spacing between adjacent spray nozzles of a corresponding printing apparatus is reduced or minimized.

BRIEF DESCRIPTION OF THE DRAWINGS

FIG. 4, which includes FIG. 4(A) and FIG. 4(B), are schematic views of a nozzle head of a printing apparatus according to other exemplary embodiments of the present invention.

DETAILED DESCRIPTION

A printing apparatus and a manufacturing method of an OLED display according to exemplary embodiments of the present invention will be described with reference to the accompanying drawings. However, the present invention is not limited to the exemplary embodiments disclosed hereinafter, but may be implemented in various different forms. The exemplary embodiments described herein provide explanation of the invention to a person of ordinary skill in the art. Like reference numerals refer to like elements throughout.

In the drawings, the thickness of layers, films, panels, regions, etc., may be exaggerated for clarity. Further, it will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on top based on a gravity direction.

In the ink-jet printing of an OLED display, to form the printing pattern on the substrate of a large size at one time, the printing material (for example, an organic material) may be sprayed onto the substrate through multiple nozzles that are arranged linearly. However, although the size of the substrate may increase to produce larger OLED displays, the pattern printed on the substrate may decrease to increase resolution. In particular, for OLED displays having high resolution, subpixels—for example, subpixels of R (red), G (green), and B (blue)—within the organic layer of the pixels may be arranged with a very small pitch between the subpixels.

Accordingly, it may be difficult when using the multiple nozzles that are linearly arranged to reduce the interval between the nozzles. That is, it may be difficult for the nozzle interval to correspond to the subpixel interval. Embodiments of the present invention provide for a printing apparatus with decreased effective nozzle intervals, and a method for manufacturing an OLED display using the printing apparatus.

Figure 1:
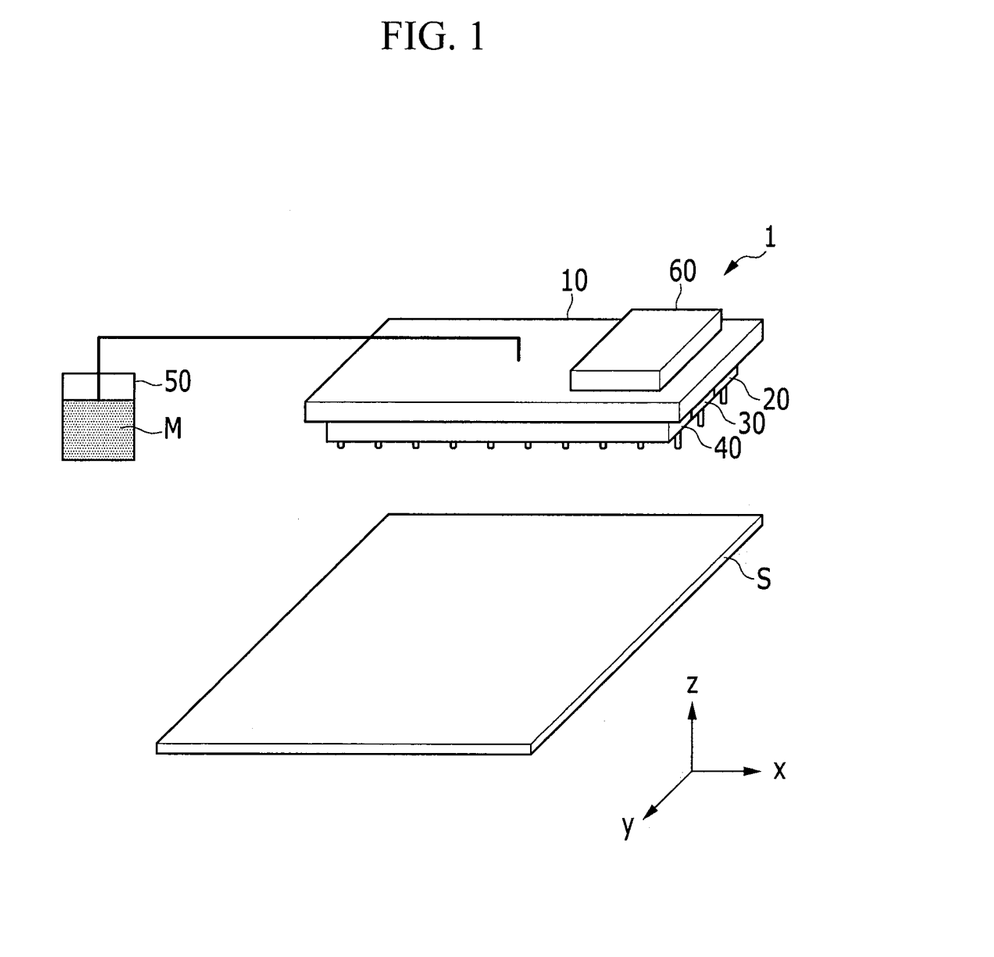
FIG. 1 is a schematic diagram of a printing apparatus according to an exemplary embodiment of the present invention.
Figure 2:
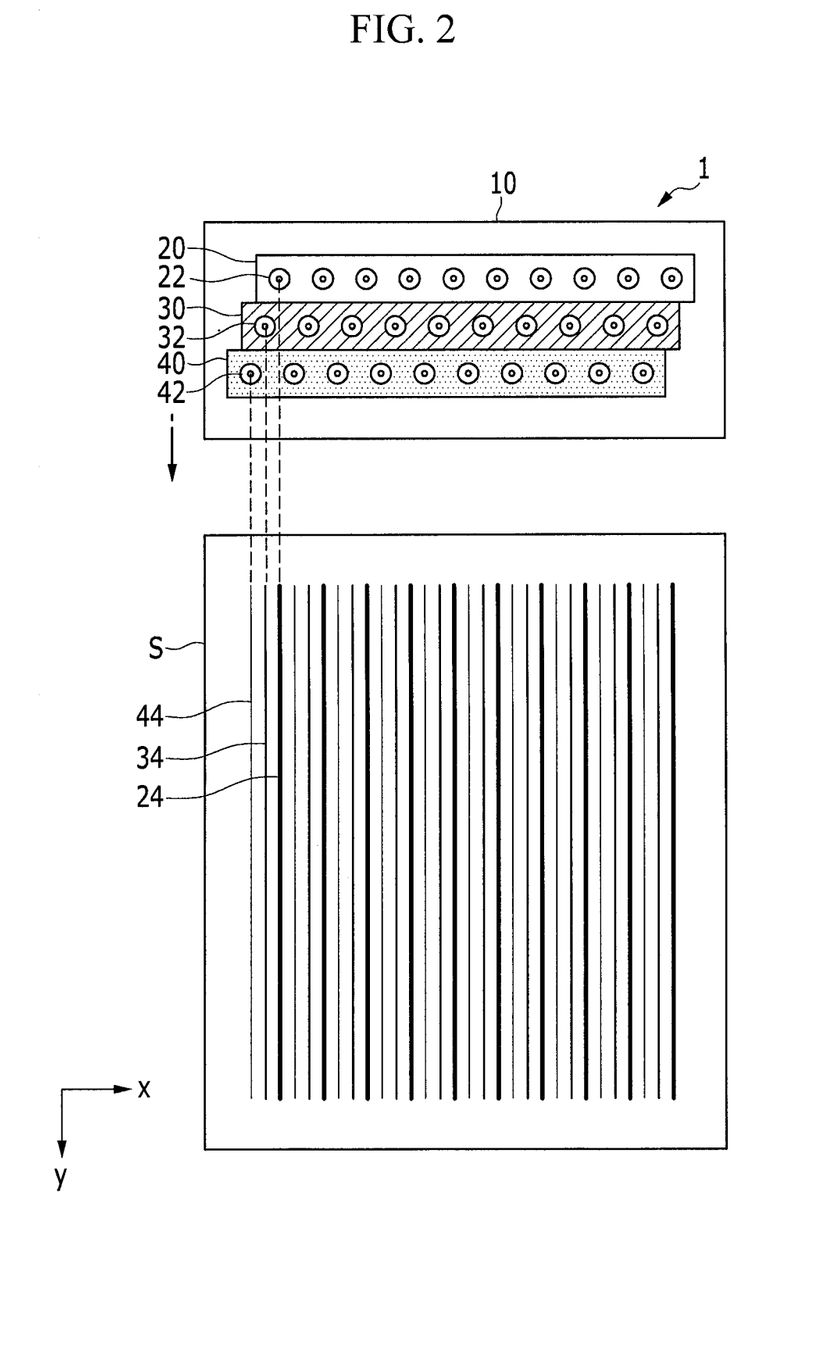
FIG. 2 is a schematic view of a nozzle head of the printing apparatus of FIG. 1.
Figure 3:
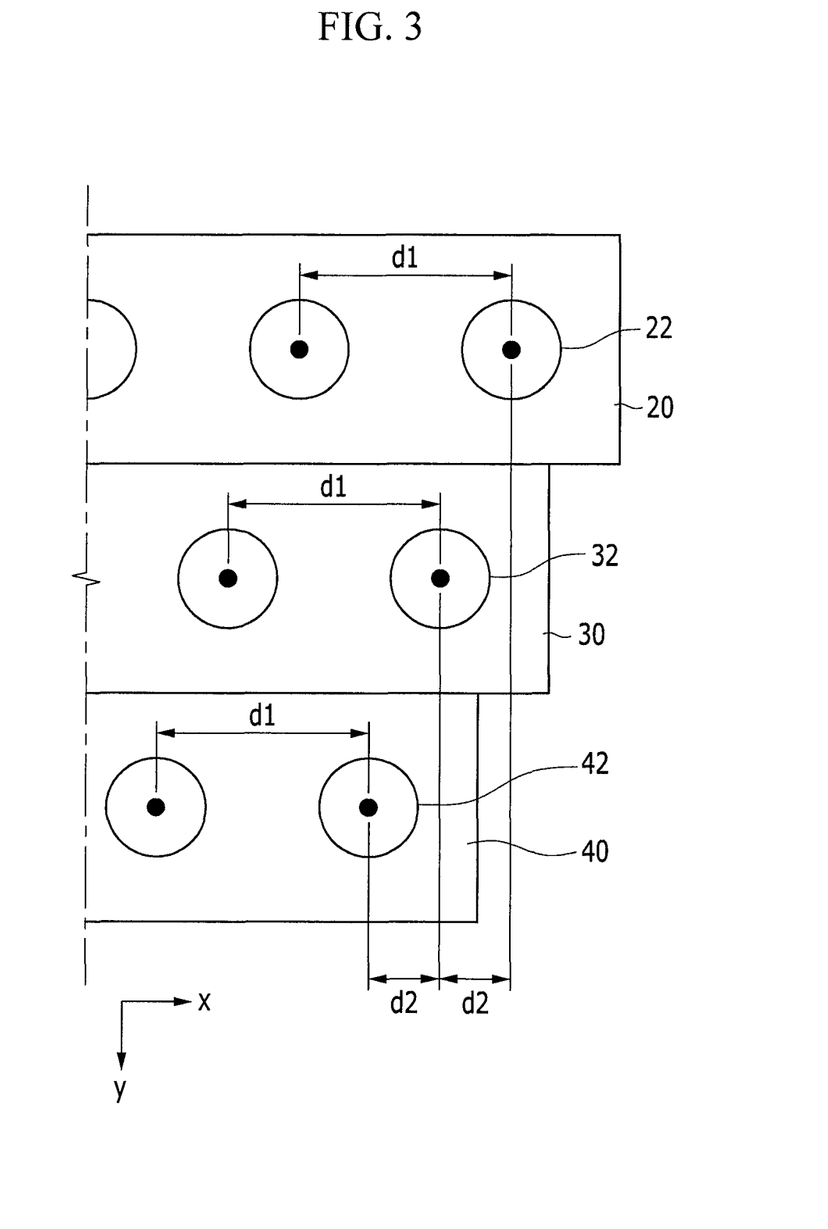
FIG. 3 is an enlarged view showing a portion of the nozzle head of FIG. 2.

FIG. 1 is a schematic diagram of a printing apparatus according to an exemplary embodiment of the present invention. FIG. 2 is a schematic view of a nozzle head 1 of the printing apparatus of FIG. 1. FIG. 3 is an enlarged view showing a portion of the nozzle head 1 of FIG. 2.

Referring to FIG. 1 to FIG. 3, the printing apparatus includes the nozzle head 1 having a nozzle head main body 10 and a plurality of linear nozzle units including first linear nozzle unit 20, second linear nozzle unit 30, and third linear nozzle unit 40. In addition, the printing apparatus includes a driver 60 for moving the nozzle head 1, and further includes a printing material supply unit 50 having printing material M to be printed.

The nozzle head 1 performs a function of receiving the printing material M supplied from the printing material supply unit 50 and discharging the printing material M on a target object S. The linear nozzle units 20, 30, and 40 of the nozzle head 1 include corresponding spray nozzles 22, 32, and 42 for spraying the printing material M on the target object S. The nozzle head main body 10 supports the plurality of linear nozzle units 20, 30, and 40.

The nozzle head 1 may be driven by one of various driving methods known to those of ordinary skill in the art according to a discharging mechanism of the printing material. Such driving methods may include, for example, a thermal driving method for discharging the ink by expanding and generating a bubble by using a heat source, and a piezoelectric driving method for discharging the ink by using pressure applied to the ink by deformation of a piezoelectric member. As such, for ease of description, further detailed description of the driving apparatus realizing this driving method may be omitted.

The nozzle head main body 10 supports the plurality of linear nozzle units 20, 30, and 40 to correspond to the target object S. The nozzle head main body 10 receives the printing material M from the printing material supply unit 50 and distributes the printing material M to each of the linear nozzle units 20, 30, and 40. A nozzle head driver 60 for moving the nozzle head 1 is installed in the nozzle head main body 10.

The linear nozzle units 20, 30, and 40 are arranged on one side of the nozzle head main body 10, thereby being supported by the nozzle head main body 10. The plurality of linear nozzle units 20, 30, and 40 are extended in a set direction (for example, a predetermined first direction, such as an x-axis direction or length direction), and are arranged in parallel in this length direction. The exemplary embodiment of FIG. 1 to FIG. 3 includes the three linear nozzle units including the first linear nozzle unit 20, the second linear nozzle unit 30, and the third linear nozzle unit 40, however the number of linear nozzle units is not limited thereto and is at least two in other embodiments.

The plurality of linear nozzle units 20, 30, and 40 may respectively spray different printing materials or the same printing material M, and may be changed according to a printing process such as the kind of target object S. For example, in the OLED display, when printing the subpixels of R (red), G (green), and B (blue) in the organic emission layer of the pixels, the plurality of linear nozzle units 20, 30, and 40 may respectively spray the organic materials corresponding to the three types of subpixels.

In the exemplary embodiment of FIG. 1 to FIG. 3, to coat the printing material M on the target object S, for convenience of description, the linear nozzle units 20, 30, and 40 spray the printing material M downward while the target object S is disposed under the linear nozzle units 20, 30, and 40. However, the present invention is not limited thereto, and in other embodiments, the linear nozzle units 20, 30, and 40 may be variously disposed while corresponding to the target object S.

In each of the linear nozzle units 20, 30, and 40, the respective plurality of spray nozzles 22, 32, and 42 are formed at set intervals (for example, at predetermined intervals) according to the first direction (e.g., length direction), to thereby spray the printing material M at the target object S. As shown in FIG. 3, the separate spray nozzles in each of the plurality of spray nozzles 22, 32, and 42 may be arranged with a first interval d1 between them in the first direction.

By an opening and closing of the spray nozzle, a supply amount of the printing material M coated on the target object S and a spray position are controlled. The linear nozzle units 20, 30, and 40 are arranged corresponding to the position of the target object S on which the printing material M will be printed, as shown in FIG. 2. In this arrangement, the printing material M is discharged on the target object S from the spray nozzles 22, 32, and 42 disposed in the respective linear nozzle units 20, 30, and 40.

As shown in FIG. 3, the spray nozzles 22, 32, and 42 of the respective linear nozzle units 20, 30, and 40 may be arranged to not be overlapped in a second direction (for example, a y-axis direction or width direction) crossing the first direction (e.g., length direction) of the linear nozzle units 20, 30, and 40. For example, if the spray nozzles 22 of the first linear nozzle unit 20 have the first interval d1 as arranged on the first linear nozzle unit 20, the spray nozzles 32 of the second linear nozzle unit 30 also have the first interval d1 as arranged on the second linear nozzle unit 30. However, the spray nozzles 32 of the second linear nozzle unit 30 are adjacent to and offset from the spray nozzles 22 of the first linear nozzle unit 20 in the first direction by a second interval d2 that is smaller than the first interval d1.

For example, for three linear nozzle units, such as the exemplary embodiment of FIG. 1 to FIG. 3, the second interval d2 may be one-third (or less) of the first interval d1, while for N linear nozzle units (N>1), the second interval d2 may be 1/N (or less) of the first interval d1. As a result, the spray nozzles 22 of the first linear nozzle unit 20 and the spray nozzles 32 of the second linear nozzle unit 30 are arranged to not overlap from the viewpoint of the second direction. In a similar fashion, the spray nozzles 42 of the third linear nozzle unit 40 are arranged to not overlap (from the viewpoint of the second direction) the spray nozzles 22 and 32 of the respective other linear nozzle units 20 and 30 by this method, and to be adjacent to and offset from the spray nozzles 32 of the second linear nozzle unit 30 in the first direction by the second interval d2.

The nozzle head driver 60 is disposed on one side of the nozzle head main body 10, as shown in FIG. 1, and may move the nozzle head 1 in the second direction—for example, the y-axis direction, that is, a crossing direction (e.g., perpendicular) to the length direction of the linear nozzle units 20, 30, and 40. The nozzle head driver 60 may have the function of linearly moving the nozzle head 1 in the y-axis direction, and the function may correspond to the constitution for driving the nozzle head 1 as would be known to one of ordinary skill in the art. Accordingly, for ease of description, further detailed description may be omitted.

While the nozzle head 1 is moved in the second direction, the spray nozzles 22, 32, and 42 of each of the respective linear nozzle units 20, 30, and 40 are arranged in the second direction to not overlap the spray nozzles arranged in the other linear nozzle units. Accordingly, corresponding printing patterns 24, 34, and 44 discharged on the target object S by the spray nozzles 22, 32, and 42 of the respective linear nozzle units 20, 30, and 40 may be printed to not overlap each other.

As depicted in FIG. 2, the printing patterns 24, 34, and 44 discharged on the target object S are separated by the second interval d2 shown in FIG. 3. The interval between adjacent spray nozzles for each of the pluralities of spray nozzles 22, 32, and 42 of the respective linear nozzle units 20, 30, and 40 is uniformly the first interval d1 as shown in FIG. 3. Further, the interval in the length direction between adjacent spray nozzles of the spray nozzles of the other linear nozzle units is uniformly the second interval d2. Thus, the effective interval d2 between the spray nozzles of the linear nozzle units 20, 30, and 40 is uniform, and the second interval d2 is smaller than the first interval d1 (that is, the actual interval between adjacent spray nozzles of the same linear nozzle unit). Thus, although the interval of the spray nozzles arranged on each of the linear nozzle units is the first interval d1, the printing patterns may be formed with the second interval d2 (that is, the effective interval) that is smaller than the first interval d1.

Also, if the nozzle head 1 is moved in the second direction of the linear nozzle units 20, 30, and 40, all the spray nozzles arranged on one linear nozzle unit may concurrently (for example, simultaneously) discharge the printing material M on the target object S such that a dry spot is not generated and the printing material sprayed from one linear nozzle unit may be uniformly dried. This is contrast to comparable embodiments where the linear nozzle unit is obliquely disposed with a predetermined angle to the printing direction.

Figure 4:
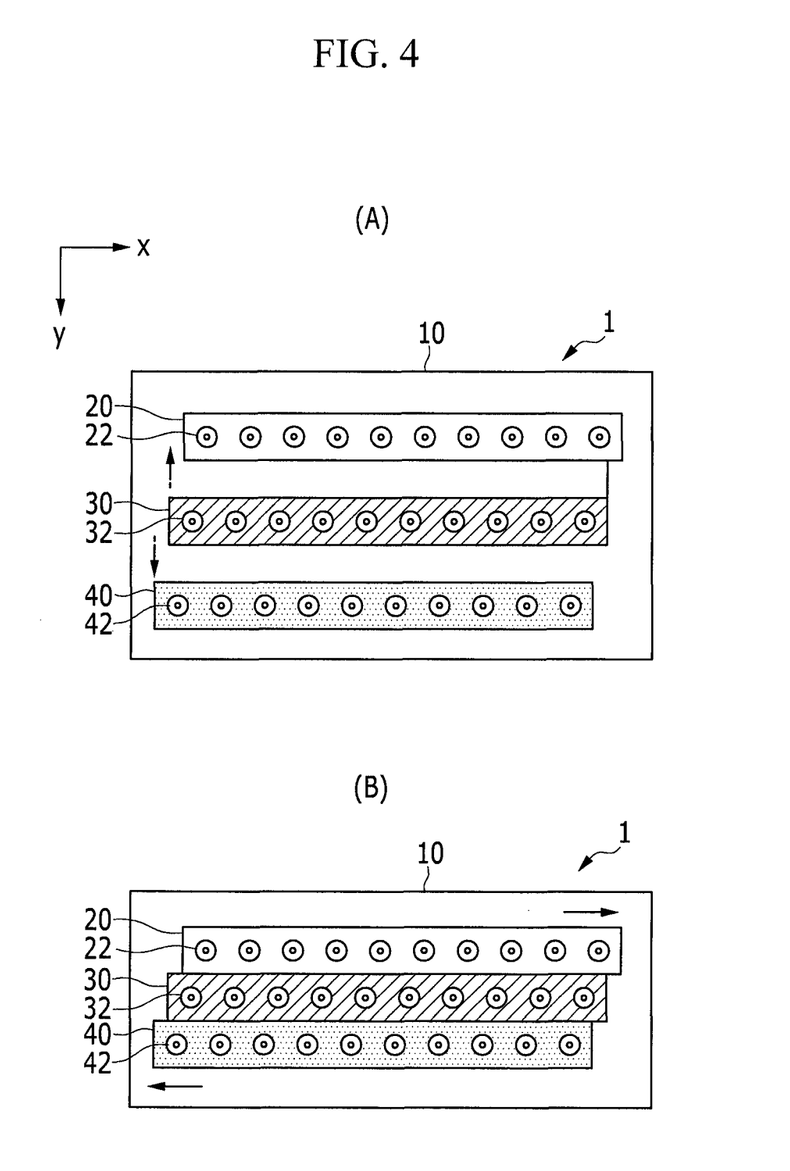

FIG. 4, which includes FIG. 4(A) and FIG. 4(B), are schematic views of a nozzle head 1 of a printing apparatus according to other exemplary embodiments of the present invention.

As shown in FIG. 4(A), the plurality of linear nozzle units 20, 30, and 40 may be moved in the second direction to be separated from each other. This may be used, for example, to generate a printing time difference between the linear nozzle units 20, 30, and 40 by widening the interval between the linear nozzle units 20, 30, and 40 in the moving direction, thereby obtaining a drying time of the printing pattern that is firstly printed. In addition, as shown in FIG. 4(B), the plurality of linear nozzle units 20, 30, and 40 may be moved in the first direction, thereby increasing or decreasing the second interval d2 in the first direction between the spray nozzles of the other linear nozzle units.

Next, an operation of the printing apparatus and a manufacturing method of an OLED display according to an exemplary embodiment of the present invention will be described.

First, a target object S on which the printing material M will be printed is arranged for the linear nozzle units 20, 30, and 40 to correspond downward, and the target object S is aligned corresponding to the position of the linear nozzle units 20, 30, and 40 (referring to FIG. 1). That is, the target object S is aligned for the printing direction to be, for example, perpendicular to the length direction of the linear nozzle units 20, 30, and 40. Here, the target object S may be a substrate for an OLED display, and the printing material M may be, for example, an organic material of an organic emission layer for the OLED display.

While the nozzle head 1 is moved in the direction crossing (for example, the direction perpendicular to) the length direction of the linear nozzle units 20, 30, and 40, the printing material M is sprayed through the spray nozzles 22, 32, and 42 of the respective linear nozzle units 20, 30, and 40 to form the corresponding printing patterns 24, 34, and 44 on the target object S. Here, the printing patterns 24, 34, and 44 may be, for example, anodes, EILs, HILs, cathodes, organic emission layers, or other organic layers of the OLED display.

The spray nozzles 22, 32, and 42 of each of the respective linear nozzle units 20, 30, and 40 are arranged to not overlap each other in the second direction. Accordingly, the corresponding printing patterns 24, 34, and 44 discharged on the target object S by the spray nozzles 22, 32, and 42 of respective linear nozzle units 20, 30, and 40 may be printed to not overlap each other. For example, when the nozzle head 1 is moved in the second direction (for example, the direction perpendicular to the length direction of the linear nozzle units 20, 30, and 40), the nozzle head 1 may be moved a plurality of times on the target object S for printing, with a different one of the plurality of linear nozzle units selectively spraying the printing material M on the target object S for each such movement.

FIG. 5A to FIG. 5D are schematic diagrams sequentially illustrating a manufacturing method of an OLED display according to an exemplary embodiment of the present invention.

Figure 5A:
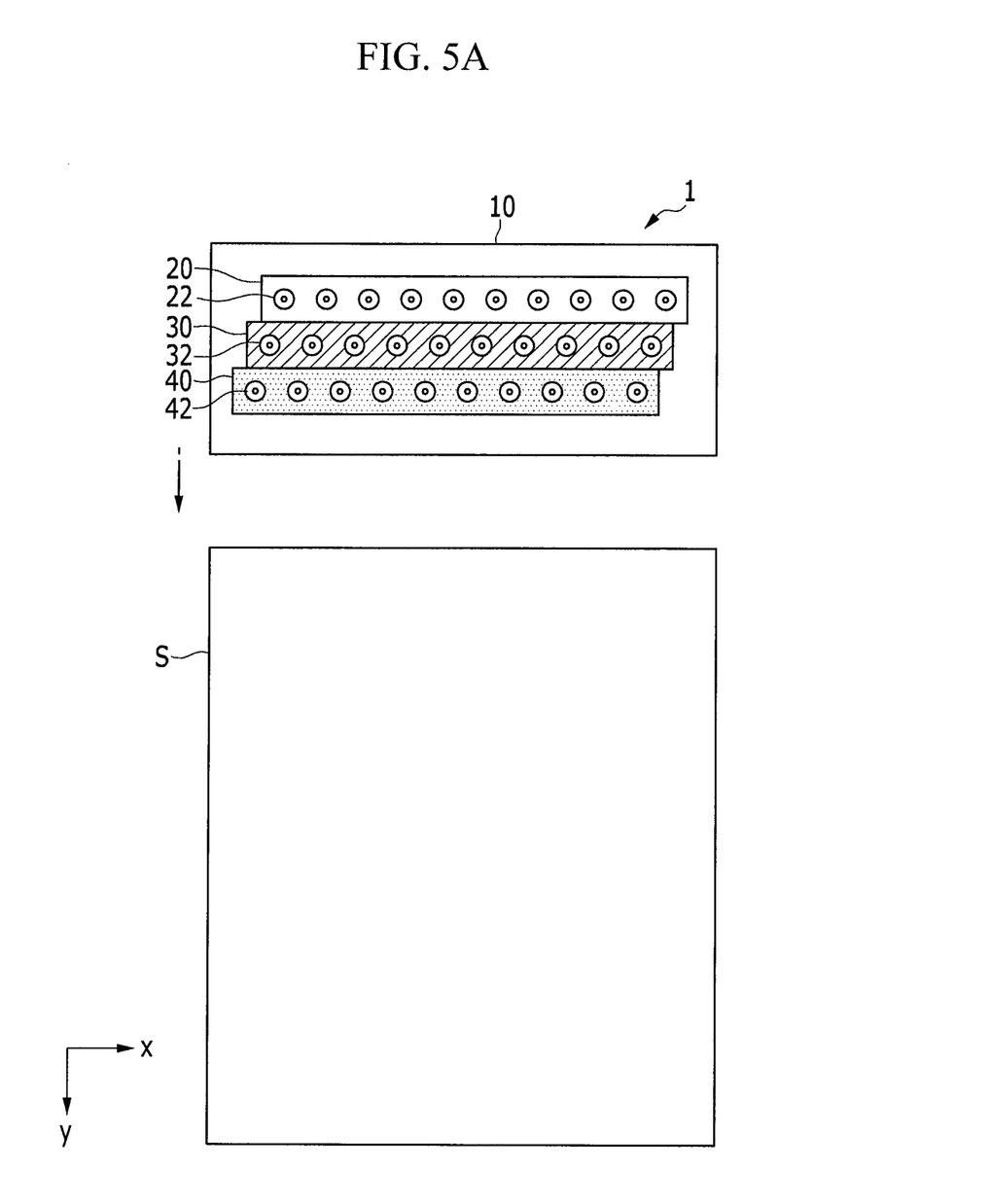
FIG. 5A to FIG. 5D are schematic diagrams sequentially illustrating a manufacturing method of an OLED display according to an exemplary embodiment of the present invention.

Referring to FIG. 5A, the nozzle head 1 is aligned such that the printing direction to be printed on the target object S crosses (for example, is perpendicular to) the length direction of the linear nozzle units 20, 30, and 40. Next, the nozzle head 1 is moved with respect to the target object S in the printing direction (e.g., a direction perpendicular to the length direction of the linear nozzle units 20, 30, and 40), and at this time, the spray nozzles 22, 32, and 42 of a respective one of the linear nozzle units 20, 30, and 40 is selected and only the spray nozzles corresponding thereto discharge the printing material M.

Figure 5B:
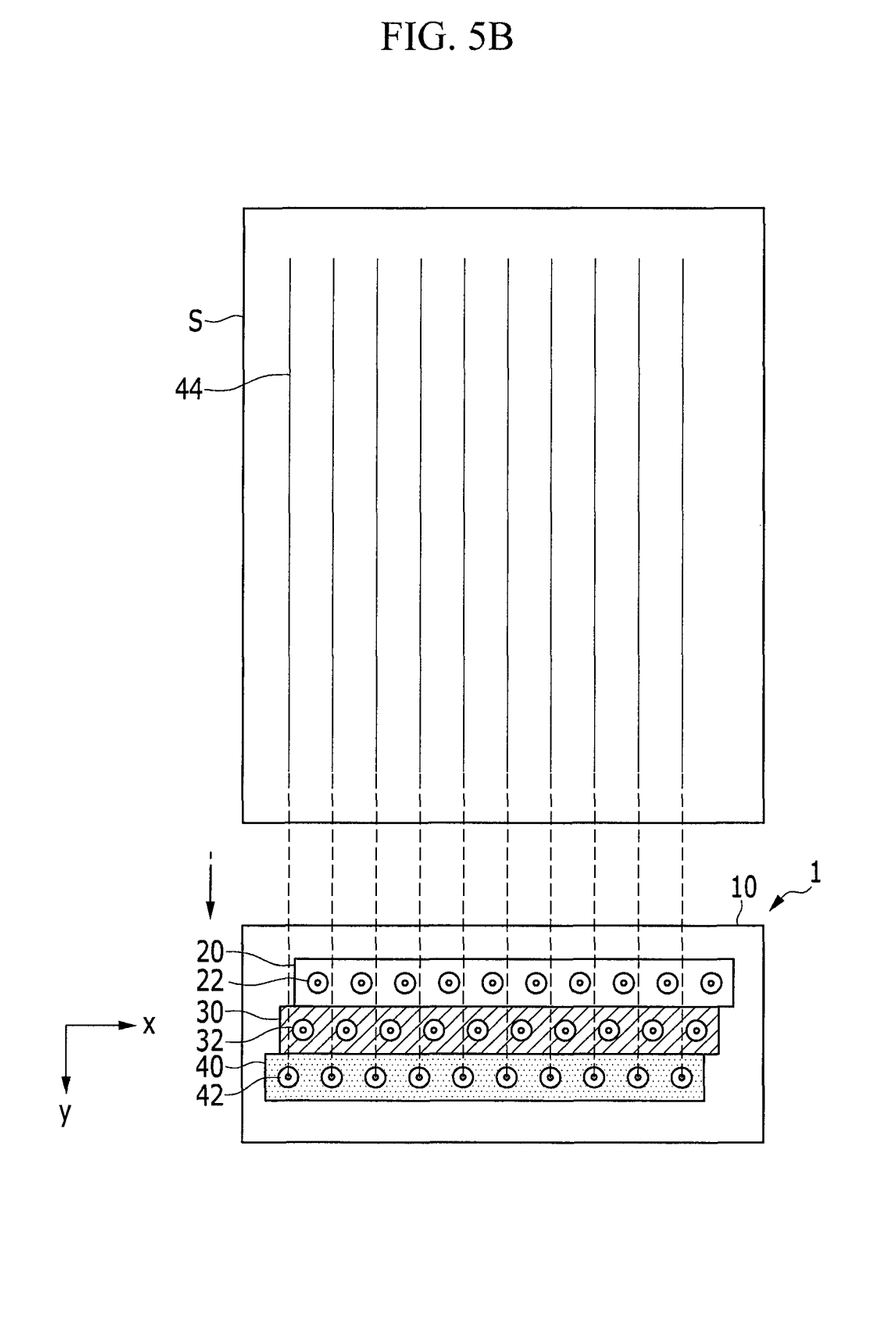
Figure 5C:
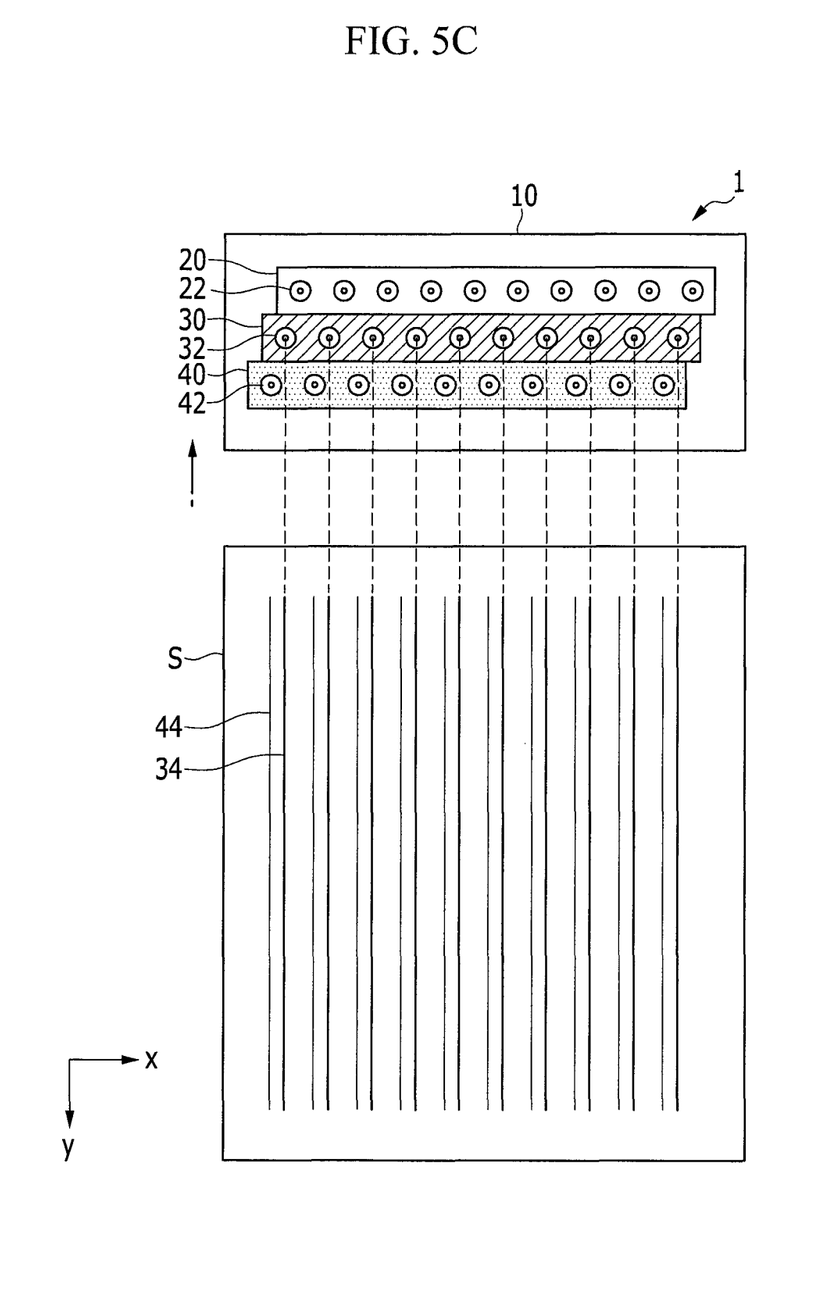
Figure 5D:
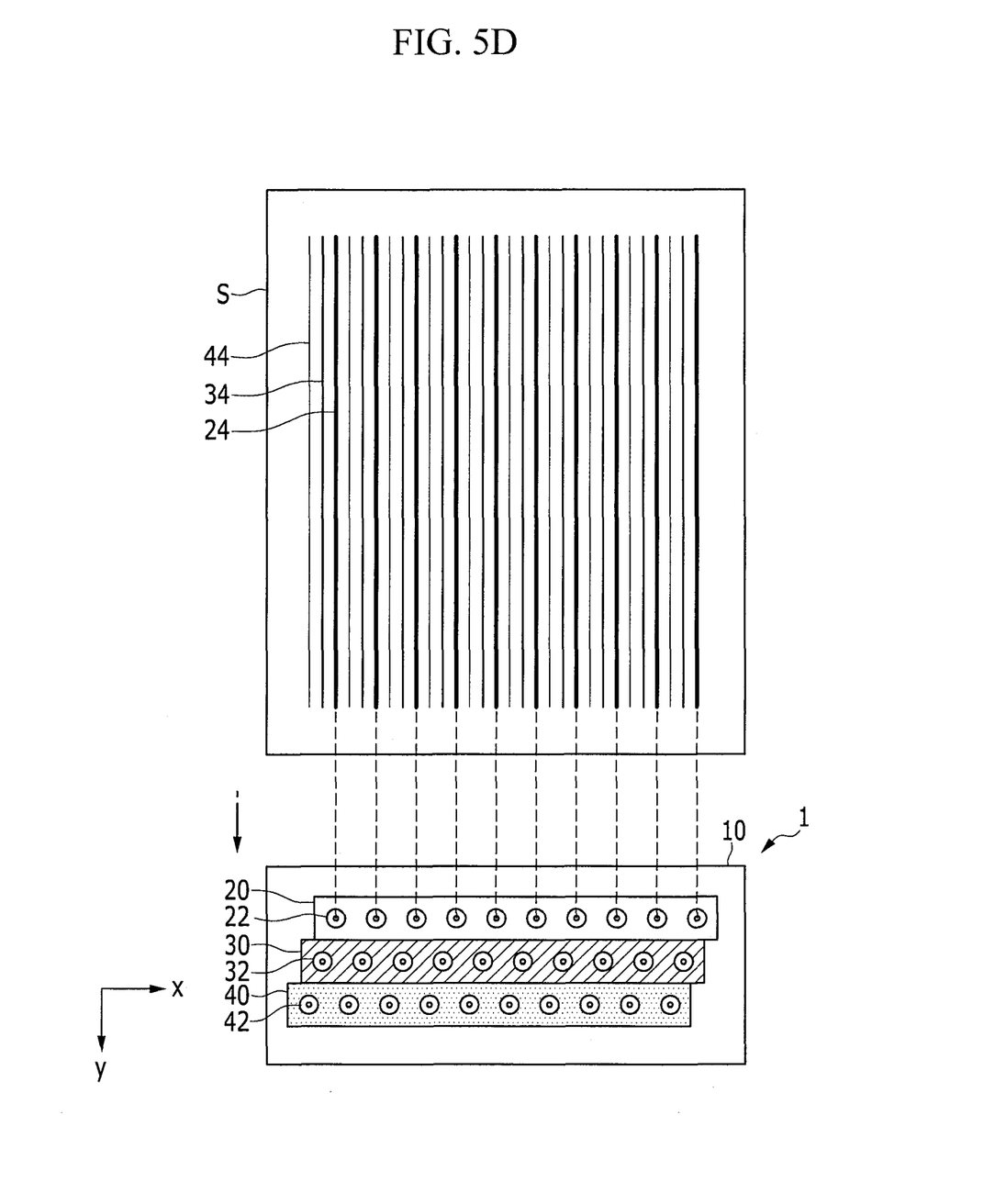

For example, as shown in FIG. 5B, when the nozzle head 1 is moved down with respect to the target object S, only the spray nozzles 42 of the third linear nozzle unit 40 discharge the printing material M to form the printing pattern 44. Next, when the nozzle head 1 is moved up in the second direction with respect to the target object S, as shown in FIG. 5C, only the spray nozzles 32 of the second linear nozzle unit 30 discharge the printing material M to form the printing pattern 34. Finally, when the nozzle head 1 is again moved down with respect to the target object S, as shown in FIG. 5D, only the spray nozzles 22 of the first linear nozzle unit 20 discharge the printing material M to form the printing pattern 24.

The plurality of movements, for example, may be reciprocal movements between one end and the other end of the target object S, as shown in FIG. 5A to FIG. 5D. That is, a direction that the nozzle head 1 is moved on the target object S in odd-numbered movements is opposite to a direction that the nozzle head 1 is moved on the target object S in even-numbered movements. As described, the different printing patterns 24, 34, and 44 are formed with a time separation for each one by being divided into a corresponding plurality of steps such that the time for drying each printing pattern may be obtained, thereby preventing a mixture between the printing patterns.

In other embodiments, before the nozzle head 1 is moved with respect to the target object S for printing, the plurality of linear nozzle units 20, 30, and 40 are separated from each other in the direction perpendicular to the length direction of the linear nozzle units 20, 30, and 40 such that the interval in the second direction between the spray nozzles 22, 32, and 44 of the respective linear nozzle units 20, 30, and 40 may be widened. In still other embodiments, before the nozzle head 1 is moved with respect to the target object S for printing, the plurality of linear nozzle units 20, 30, and 40 are moved in the length direction to control the second interval d2 in the second direction between the spray nozzles of different linear nozzle units such that the interval between the printing patterns may be desirably changed.

In some of the above exemplary embodiments, the organic emission layer pattern is printed in the manufacturing of the OLED display. However, these exemplary embodiments may be equally applied when printing a pattern of an organic semiconductor material in the manufacture of organic thin film transistors (OTFTs). However, this is just illustrative and the invention is not limited thereto, and various modifications are possible as would be apparent to one of ordinary skill in the art. That is, embodiments of the present invention may be applied to all printing work repeatedly forming the same printing patterns by discharging, for example, ink drops of a set quantity (for example, a predetermined quantity) from the nozzles of the ink-jet head at set positions (for example, predetermined positions) of the printing media.

For example, when forming the organic emission layer of the OLED display according to the exemplary embodiment of FIG. 5A to 5D, the target object S is the substrate of the OLED display and the printing material M is the organic material used in forming the organic emission layer of the OLED display. The organic material includes three organic materials for respectively forming the subpixels of R (red), G (green), and B (blue), and each organic material may be sprayed through the respective first to third linear nozzle units 20, 30, and 40.

In addition, when the nozzle head is first moved from one end of the substrate to the other end, the organic material for the R subpixels is sprayed. When the nozzle is next moved from the other end of the substrate back to the one end, the organic material for the G subpixels is sprayed. Finally, when the nozzle is again moved from the one end of the substrate to the other end, the organic material for the B subpixels is sprayed.

Figure 6:
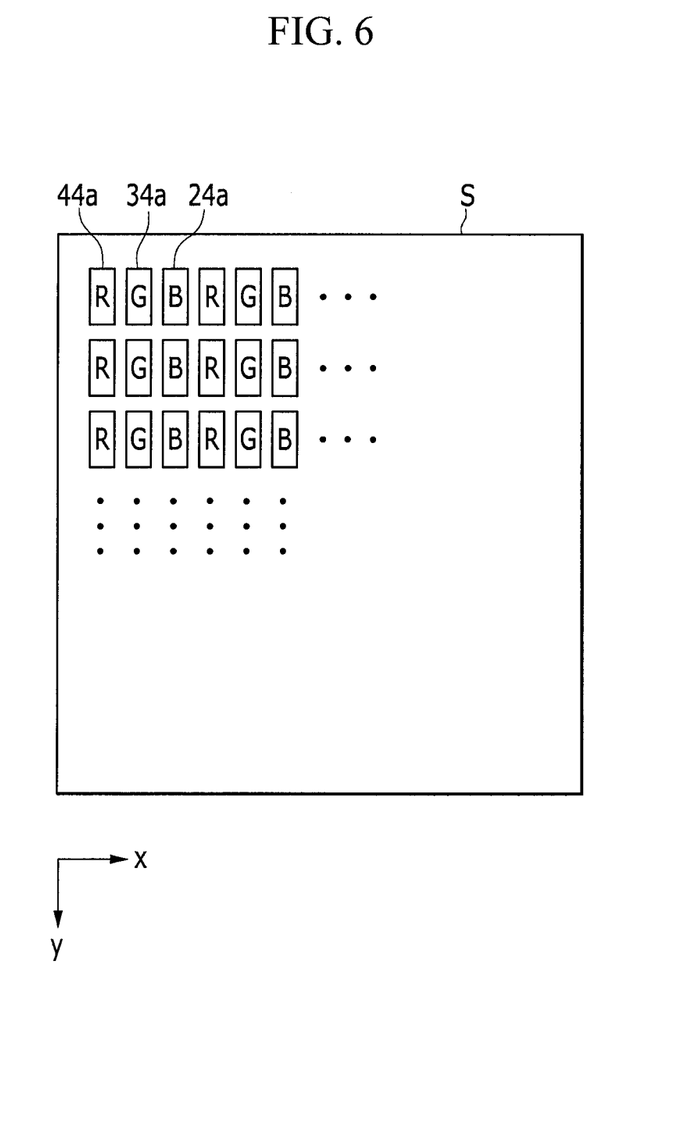
FIG. 6 is a schematic view of an organic layer for pixels formed according to the manufacturing method of FIG. 5.

FIG. 6 is a schematic view of an organic layer for pixels formed according to the manufacturing method of FIG. 5.

As described above, if each organic material is sprayed through the first to third linear nozzle units 20, 30, and 40, as shown in FIG. 6, R subpixels 44a, G subpixels 34a, and B subpixels 24a may be formed with a set interval (for example, a predetermined interval).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS

1: nozzle head
10: nozzle head main body
20: first linear nozzle unit
30: second linear nozzle unit
40: third linear nozzle unit
50: printing material supply unit
60: nozzle head driver

What is claimed is:
1. A printing apparatus comprising:
a nozzle head comprising a nozzle head main body and at least three linear nozzle units for spraying a printing material, the linear nozzle units being on one side of the nozzle head main body and elongated in parallel with each other in a first direction, each of the at least three linear nozzle units comprising a plurality of spray nozzles separated by a first interval in the first direction, corresponding adjacent said spray nozzles from different ones of the at least three linear nozzle units being separated by a second interval that is at most one third of the first interval in the first direction; and a nozzle head driver connected to the nozzle head main body and configured to move the nozzle head in a second direction crossing the first direction.

2. The printing apparatus of claim 1, wherein the second direction is perpendicular to the first direction.

3. The printing apparatus of claim 1, wherein
a number of the at least three linear nozzle units is N, and the second interval is 1/N times the first interval in the first direction.

4. A method of manufacturing an organic light emitting diode (OLED) display with a printing apparatus comprising a nozzle head comprising a nozzle head main body and a plurality of linear nozzle units for spraying an organic material, the linear nozzle units on one side of the nozzle head main body and elongated in parallel with each other in a first direction, the method comprising:
   forming an organic layer by using the printing apparatus to spray the organic material onto a substrate arranged opposite to the linear nozzle units while moving the nozzle head in a second direction crossing the first direction, the forming of the organic layer comprising:
      spraying the organic material onto the substrate from only a first one of the linear nozzle units while moving the nozzle head in a first movement in the second direction; and
      spraying the organic material onto the substrate from only a second one of the linear nozzle units while moving the nozzle head in a second movement in the second direction.

5. The method of claim 4, wherein the second direction is perpendicular to the first direction.

6. The method of claim 4, wherein
each of the plurality of linear nozzle units comprises a plurality of spray nozzles separated in the first direction by a first interval, and
corresponding adjacent said spray nozzles from different ones of the plurality of linear nozzle units are separated by a second interval that is smaller than the first interval in the first direction.

7. The method of claim 6, wherein
a number of the plurality of linear nozzle units is N, and the second interval is 1/N times the first interval in the first direction.

8. The method of claim 6, further comprising:
separating the plurality of linear nozzle units in the first direction before moving the nozzle head in the second direction such that an interval in the first direction between the spray nozzles of different ones of the linear nozzle units is controlled.

9. The method of claim 4, wherein the first and second movements are reciprocal movements between one end and another end of the substrate.

10. The method of claim 4, further comprising:
separating the plurality of linear nozzle units in the second direction before moving the nozzle head in the second direction such that an interval in the second direction between the linear nozzle units is widened.

11. A printing apparatus comprising:
a nozzle head comprising a nozzle head main body and a plurality of linear nozzle units for spraying a printing material, the linear nozzle units on one side of the nozzle head main body and elongated in parallel with each other in a first direction; and
a nozzle head driver connected to the nozzle head main body and configured to move the nozzle head in a second direction crossing the first direction,
wherein the plurality of linear nozzle units are movable with respect to each other.

12. The printing apparatus of claim 11, wherein the plurality of linear nozzle units are movable with respect to each other in the second direction.

13. The printing apparatus of claim 11, wherein the plurality of linear nozzle units are movable with respect to each other in the first direction.

* * * * *